United States Patent
Neel et al.

(10) Patent No.: US 10,697,839 B2
(45) Date of Patent: *Jun. 30, 2020

(54) DEVICE AND METHOD FOR DETECTING THE APPROACH AND/OR CONTACT AND PRESSURE OF AN OBJECT IN RELATION TO A DETECTION SURFACE

(71) Applicant: FOGALE NANOTECH, Nîmes (FR)

(72) Inventors: Christian Neel, Nîmes (FR); Frédéric Ossart, Langlade (FR); Didier Roziere, Nîmes (FR)

(73) Assignee: FOGALE NANOTECH, Nîmes (FR)

( * ) Notice: Subject to any disclaimer, the term of this patent is extended or adjusted under 35 U.S.C. 154(b) by 0 days.

This patent is subject to a terminal disclaimer.

(21) Appl. No.: 16/469,032

(22) PCT Filed: Nov. 23, 2017

(86) PCT No.: PCT/EP2017/080166
§ 371 (c)(1),
(2) Date: Jun. 12, 2019

(87) PCT Pub. No.: WO2018/108476
PCT Pub. Date: Jun. 21, 2018

(65) Prior Publication Data
US 2019/0331538 A1 Oct. 31, 2019

(30) Foreign Application Priority Data

Dec. 16, 2016 (FR) .................................... 16 62614

(51) Int. Cl.
*G01L 1/14* (2006.01)
*B25J 13/08* (2006.01)
(52) U.S. Cl.
CPC ............... *G01L 1/14* (2013.01); *B25J 13/087* (2013.01)

(58) Field of Classification Search
CPC .................................. G01L 1/14; B25J 13/087
(Continued)

(56) References Cited

U.S. PATENT DOCUMENTS

| | | | | |
|---|---|---|---|---|
| 5,942,733 A | * | 8/1999 | Allen | .................. G06K 9/00335 178/18.01 |
| 10,175,832 B2 | * | 1/2019 | Roziere | .................. G06F 3/0416 |

(Continued)

FOREIGN PATENT DOCUMENTS

| | | |
|---|---|---|
| JP | 5888686 B2 | 3/2016 |
| WO | 2013093326 A1 | 6/2013 |
| WO | 2015144474 A2 | 10/2015 |

OTHER PUBLICATIONS

French Search Report from French Patent Application No. 1662614, dated Aug. 30, 2017.

(Continued)

*Primary Examiner* — Marrit Eyassu
(74) *Attorney, Agent, or Firm* — Greer, Burns & Crain, Ltd.

(57) ABSTRACT

A detection device including:
 a measurement electrode, and a second electrode separated from one another by a distance (D) that is elastically modifiable locally, by a load exerted by an object on a detection surface, and
 a controller arranged in order to:
  connect the electrodes to an alternating guard potential ($V_g$) in order to measure a capacitance representing an approach and a contact; and
  connect the second electrode to a second potential a second potential proportional to the guard potential ($V_g$) and having a different amplitude, or to the ground potential (G), in order to measure a capacitance representing a pressure.

(Continued)

Also provided is a detection method utilizing such a detection device.

18 Claims, 5 Drawing Sheets

(58) Field of Classification Search
    USPC .................................................. 73/862.626
    See application file for complete search history.

(56) References Cited

U.S. PATENT DOCUMENTS

| | | | | |
|---|---|---|---|---|
| 2005/0257628 A1* | 11/2005 | Nikaido | ................ | B60N 2/002 73/862.541 |
| 2011/0267296 A1* | 11/2011 | Noguchi | ............... | G06F 3/0412 345/173 |
| 2012/0075237 A1* | 3/2012 | Ikeda | ...................... | G06F 3/044 345/174 |
| 2012/0132006 A1* | 5/2012 | Roziere | ................... | G01D 5/24 73/724 |
| 2012/0188200 A1* | 7/2012 | Roziere | ................ | G06F 3/0416 345/174 |
| 2012/0262389 A1* | 10/2012 | Kida | ..................... | G06F 3/0412 345/173 |
| 2014/0028625 A1* | 1/2014 | Maeda | ................... | G06F 3/044 345/174 |
| 2014/0118639 A1* | 5/2014 | Matsushima | ....... | G02F 1/13338 349/12 |
| 2014/0292713 A1* | 10/2014 | Koito | ................... | G06F 3/0412 345/174 |
| 2014/0360854 A1* | 12/2014 | Roziere | .................... | G01L 1/04 200/5 R |
| 2016/0154488 A1* | 6/2016 | Kim | .................... | G06F 3/03547 715/846 |
| 2017/0083147 A1* | 3/2017 | Su | ........................ | G06F 3/0416 |

OTHER PUBLICATIONS

International Search Report from International Patent Application No. PCT/EP2017/080166, dated Mar. 8, 2018.
Written Opinion of the International Search Authority from International Patent Application No. PCT/EP2017/080166, dated Mar. 8, 2018.

* cited by examiner

DEVICE AND METHOD FOR DETECTING THE APPROACH AND/OR CONTACT AND PRESSURE OF AN OBJECT IN RELATION TO A DETECTION SURFACE

BACKGROUND

The present invention relates to a device for detecting on the one hand the approach and contact of said object with the detection surface, and on the other hand the pressure of said object on said surface. It also relates to a method utilizing such a device.

The field of the invention is, non-limitatively, that of interfaces for the capacitive detection of objects for an electronic device, making it possible for said device to detect neighbouring objects, in particular in the field of robotics.

Electronic devices interact with their environment in an increasingly autonomous manner. This autonomous interaction most often requires the possibility of detecting objects/persons located in proximity to or in contact with the device, in particular when said device is a robot, whether or not it is mobile. Such detection of approach and contact is carried out by means of a detection surface equipped with sensors for detecting approach and/or contact, in particular capacitive sensors.

In order to complete this interaction, it appears necessary to detect, in addition to the approach and contact, a pressure, a force or a load exerted by an object on a detection surface of the device. Sensors currently exist for detecting a pressure on a detection surface of an device.

However, the addition of such a pressure detection sensor in a detection surface already equipped with approach and contact sensors proves to be costly, bulky and complex. In addition, the juxtaposition of sensors dedicated to the detection of approach and contact and sensors dedicated to the detection of a pressure creates mutual interferences that degrade the operation and the effectiveness of these sensors.

A purpose of the present invention is to overcome the abovementioned drawbacks.

Another purpose of the present invention is to propose a single sensor device making it possible to detect on the one hand approach and/or contact, and on the other hand the pressure of an object on a detection surface, and/or the force or the load exerted by this object on the detection surface.

Yet another purpose of the present invention is to propose a single sensor device making it possible to detect on the one hand the approach and/or contact, and on the other hand a pressure, a force or a load, that is less bulky, less costly and less complex compared to a juxtaposition of two existing sensors, one dedicated to the detection of approach and contact and the other dedicated to the detection of pressure, force or load.

Yet another purpose of the present invention is to propose a single sensor device making it possible to detect on the one hand the approach and/or the contact, and on the other hand a pressure, a force or a load, with a great reliability and a good dependability.

SUMMARY

At least one of these purposes is achieved with a device for detecting an object with respect to a detection surface, comprising:
at least one electrode, called measurement electrode, and at least one second electrode, placed opposite said measurement electrode;

characterized in that said electrodes are separated by a distance that is elastically modifiable, in particular locally, by a load exerted by said object on said detection surface; and in that it comprises at least one control module arranged in order to:
apply to said electrodes:
one and the same alternating potential, called guard potential, or
alternating potentials that are substantially identical;
that is(are) different from a ground potential, so as to measure a first electrical signal with respect to a capacitance, called electrode-object capacitance, between said measurement electrode and said object: the first signal, and consequently
the electrode-object capacitance, are representative of an approach and/or a contact of said object with said detection surface; and
apply to said second electrode:
a second potential proportional to the guard potential and having a different amplitude, or
the ground potential,
so as to measure a second electrical signal with respect to the capacitance, called total capacitance, seen by said measurement electrode: the second signal and consequently the total capacitance, are representative of a pressure, a force or a load exerted by said object with said detection surface.

Thus, the device according to the invention makes it possible to measure, with a single measurement electronics and a single set of electrodes, on the one hand a first signal representative of a first item of information which is the approach and the contact of an object with the detection surface, and on the other hand a second signal representative of a second item of information which is the pressure, the force or the load exerted by the object on the detection surface.

Consequently, the device according to the invention is less costly, less bulky and less complex to utilize compared to a juxtaposition of two dedicated sensors, one for the detection of approach and contact, and the other for the detection of pressure. In addition, the device according to the invention has a better detection performance compared to a configuration using two independent sensors that could interfere with one another.

According to embodiments, the control module can also be arranged in order to apply the second potential or the ground potential to the second electrode so as to measure the second electrical signal with respect to the total capacitance when the electrode-object capacitance reaches a predetermined threshold capacitance, or is within a predetermined range of threshold capacitances, representative of a contact between said object and said detection surface.

Of course, initiating the measurement of the first and second electrical signal can also be carried out as a function of other criteria, or simply periodically or alternately.

An electrical potential can be applied to electrodes, non-limitatively, by electrically connecting these electrodes to this potential, or by subjecting these electrodes, directly or via electronic components and/or tracks or connecting wires and/or any other means of electrical coupling (electric field, induction), to this electrical potential or to a source generating this electrical potential.

Similarly, in the context of the invention, electrically polarizing electrodes at an electrical potential can mean for example subjecting these electrodes to the electrical potential, or applying the electrical potential to the electrodes.

By "ground potential" is meant a reference potential for the electronics or a part of the electronics. A ground potential can also correspond to an earth or an earth potential.

The electrical potentials can be defined, without loss of generality, with respect to an electrical reference which can be the reference point of the source which generates them, or a general reference potential such as a ground potential.

By "alternating potential" is meant a potential that is variable over time with at least one frequency component at a non-zero frequency.

The guard potential can thus be defined (or referenced), non-limitatively, with respect to the ground potential. In this case, the guard potential can also correspond to a potential difference with respect to the ground potential considered as zero.

According to embodiments, the guard potential can be of any shape, and in particular sinusoidal, square, triangular, etc. This potential can be generated directly, or by using pulse width modulation (PWM) techniques.

In the context of the present invention, alternating potentials applied to electrodes (such as a measurement electrode and a second electrode) can be considered to be substantially identical when they do not generate (with the measurement electronics utilized) usable capacitance measurements between these electrodes. The following can in particular be mentioned as examples of alternating electrical potentials that are identical or substantially identical:

alternating potentials having one and the same temporal shape (sinusoidal, square, triangular, etc.), one and the same variation amplitude and one and the same phase (or in other words varying synchronously);

alternating potentials which comprise at least one spectral component with identical amplitude and phase at at least one working frequency.

It should be noted that the electrodes can be polarized, or subjected to a global potential, corresponding to a superposition of an alternating electrical potential called "guard potential" that is identical or substantially identical for each electrode and other potentials with other components that are optionally different for each electrode but which do not generate a usable capacitance measurement with the measurement electronics utilized.

Thus, according to embodiments of the measurement electronics as they, will be detailed hereinafter, the object-electrode capacitance can be measured by applying respectively to a measurement electrode and to a second electrode global potentials comprising an identical alternating electrical guard potential, and different components such as a DC component, or a frequency component which is not within the passband for detection of the measurement electronics, or also another component with a waveform orthogonal in the sense of the scalar product to that of the guard potential (i.e. the sum of the products term-by-term is zero).

The second potential corresponds to a potential which, when it is applied to a second electrode, generates (with the measurement electronics utilized) a measurement of capacitance between a measurement electrode (at the guard potential) and this second electrode. To this end, it must have an amplitude different to the guard potential. It can also have zero amplitude, in which case it corresponds to the ground potential.

The second potential is also defined as being proportional to the guard potential. This means that it comprises a component that is identical in terms of waveform and/or frequency and phase to the guard potential, but, as explained above, having a different amplitude.

This amplitude is preferably less than the amplitude of the guard potential, but it can also be greater. Thus, it is possible in particular to mention as examples of second potentials:

an alternating potential having one and the same temporal shape (sinusoidal, square, triangular, etc.), one and the same phase (or in other terms varying synchronously) as the guard potential, but a different variation amplitude;

an alternating potential which comprises at least one spectral component of the same phase at at least one working frequency, but having a different amplitude.

The fact of applying a second potential of non-zero amplitude instead of a ground potential to a second electrode makes it possible as it were to adjust a gain or sensitivity of measurement of the total capacitance which can be much greater than the electrode-object capacitance:

by applying the ground potential to a second electrode, a potential difference corresponding to the guard potential is obtained between a measurement electrode and this second electrode;

by applying a second potential proportional to the guard potential and of non-zero amplitude to a second electrode, it is possible to obtain, (for a suitable choice of amplitude), between a measurement electrode and this second electrode, a potential difference less than the guard potential.

Of course, as above, it should be noted that the measurement electrodes and second electrodes can be polarized, or subjected to a global potential, corresponding to a superposition, respectively, of a guard potential or a second potential, and other potentials with other components that are optionally different for each electrode but which do not generate a usable capacitance measurement with the measurement electronics utilized.

The device according to the invention can comprise measurement electronics connected to the measurement electrode and making it possible to measure the first signal with respect to the electrode-object capacitance and the second signal with respect to the total capacitance.

Advantageously, this first signal with respect to the electrode-object capacitance and this second signal with respect to the total capacitance, seen by the measurement electrode, can be measured at one and the same measurement point.

Thus, the implementation of the device according to the invention is simplified.

According to embodiments, the device according to the invention can comprise measurement electronics with a circuit implementing an operational amplifier with an impedance comprising a capacitive feedback component, the measurement electrode or electrodes being connected to the negative input of said operational amplifier.

The measurement electronics can thus for example utilize a charge amplifier with feedback capacitance.

The circuit utilizing an operational amplifier can be produced in any form, in particular analogue or digital, making it possible to perform an operational amplifier function.

It is recalled that an operational amplifier is a component model that is well known to a person skilled in the art, with a positive input and a negative input having ideal infinite impedance, and which generates at the output a signal corresponding to the difference of the potentials applied to the inputs, amplified with an ideal infinite gain.

The device according to the invention can also comprise measurement electronics with a circuit implementing a circuit for the conversion of charges to an electrical or digital signal (switched capacitance, etc.).

According to embodiments, the circuit implementing an operational amplifier can be supplied by an electrical supply referenced to the guard potential.

According to other embodiments, the circuit implementing an operational amplifier can be supplied by an electrical supply referenced to ground.

According to embodiments, the device according to the invention can comprise measurement electronics with at least one demodulation means utilizing at least one of the following elements:
- a synchronous demodulator;
- an amplitude detector;
- a digital demodulator.

Generally, a synchronous demodulator can be represented by (or comprise) a multiplier which carries out a multiplication of the measurement signal with the carrier signal and a low-pass filter.

The carrier signal can be, or comprise, or be derived from, the guard potential (or at least from the potential difference between the ground and the guard potential).

An amplitude detector (or asynchronous demodulator) can be represented by (or comprise) a rectifying element such as a diode rectifier, selector switches or a quadratic detector, and a low-pass filter. It makes it possible to obtain the amplitude of the modulated measurement signal originating from the current detector.

The demodulation means can also comprise pass band or anti-aliasing low-pass filters placed before the demodulation.

Of course, the demodulation means can be produced in a digital and/or analogue form. They can in particular comprise an analogue-to-digital converter and a microprocessor and/or an FPGA which digitally carries out synchronous demodulation, amplitude detection or any other demodulation operation.

The device according to the invention can comprise at least one controllable switch, such as a contact breaker, controlled by the control module, and which:
- in a first position: connects the at least one second electrode to the guard potential; and
- in a second position: connects the at least one second electrode to the ground potential or to the second potential.

In the embodiments utilizing several second electrodes, the controllable switch can be arranged so as to:
- simultaneously connect all the second electrodes either to the guard potential or the ground potential or the second potential; or
- selectively connect one or a plurality of second electrodes to the ground potential or the second potential and the other second electrodes to the guard potential.

According to an embodiment example, the device according to the invention can advantageously comprise a single source supplying the guard potential to all the electrodes.

Alternatively, the device according to the invention can comprise:
- a first source supplying the guard potential to the at least one measurement electrode, and
- a second source supplying the guard potential to the at least one second electrode, during the measurement of the first signal, and, if appropriate, supplying the second potential to the at least one second electrode during the measurement of the second signal.

According to embodiments, the second source can be independent of the first source, or dependent on or slaved to the first source, or share common elements (such as an oscillator or a wave generator) with the first source.

In a first embodiment example, the second source is turned on during the measurement of the first signal so as to supply the guard potential, and during the measurement of the second signal so as to supply the second potential. In particular, the amplitude of the second source can be controlled by the control means.

In a second embodiment example, the second source is turned on during the measurement of the first signal and turned off during the measurement of the second signal. In particular, the second source can be turned on and turned off by the control means.

In another embodiment example, the second source can be kept powered at all times. In this case, the device according to the invention can comprise a controllable switch connecting the at least one second electrode:
- to the second source during the measurement of the first signal; and
- to the ground during the measurement of the second signal.

This controllable switch can in particular be controlled by the control means.

The control module can be a processor or an electronic chip configured in order to carry out the control operations described.

Such a processor, or such an electronic chip, can be dedicated or not to carrying out said control operations.

Advantageously, the device according to the invention can also comprise at least one calculation module configured in order to calculate a capacitance, called inter-electrode capacitance, between said measurement electrode and said second electrode, as a function of said total capacitance and said electrode-object capacitance.

Such a calculation module can be configured in order to calculate the inter-electrode capacitance $C_{ie}$ by subtraction, from the total capacitance $C_T$, of said electrode-object capacitance $C_{eo}$ according to the following relationship:

$$C_{ie} = C_T - C_{eo}$$

According to embodiments, the electrode-object capacitance can be obtained from a previous measurement. It can also be a recorded measurement.

When the total capacitance measurement is carried out as a function of the comparison of the electrode-object capacitance with a threshold capacitance $C_s$ or a predetermined range of threshold capacitances, this threshold capacitance $C_s$ can be used as the value of the electrode-object capacitance in order to calculate the inter-electrode capacitance.

This threshold capacitance can be fixed, for example predetermined in the factory.

This threshold capacitance can also be adaptive. In this case, it can be determined or updated for example as a function of the preceding measurements, a history measurement and/or a measurement environment such as that which will be described hereinafter.

The device according to the invention can also comprise at least one calculation module configured in order to:
- determine a distance or a contact (or a semi-contact) between the object and the detection surface as a function of the first signal (and/or a speed, a path, a movement, a gesture, etc.); and/or
- determine a load, a force or a pressure applied by said object on the detection surface as a function of the second signal.

The at least one calculation module can determine said distance (or contact), respectively said load (or force or pressure), by calculation or by comparison with a previously established reference table.

The at least one calculation module can determine said distance or contact:
  directly as a function of the first measured signal or of a digitized version of said signal; or
  of an electrode-object capacitance value deduced from said first signal, measured or digitized.

The at least one calculation module can determine said load (or force or pressure):
  directly as a function of the measured second signal or of a digitized version of said signal; or
  from a total capacitance value deduced from said measured or digitized second signal; or
  from an inter-electrode capacitance value, calculated as a function of said total capacitance and of the threshold capacitance.

Advantageously, the measurement electrode and the second electrode can be separated by a layer that is elastically compressible, in particular locally, comprising, or formed by, a dielectric material.

The dielectric material can for example comprise:
  a dielectric fluid, such as oil;
  a dielectric polymer, such as a silicon-based polymer; or
  a dielectric foam, such as a foam made from polyester or silicone.

According to embodiments, the device according to the invention can comprise one or more measurement electrodes and/or second electrodes produced for example:
  from a deposit of conductive ink, deposited for example with a screen printing or ink jet process, on a surface of dielectric material;
  from layers of metallic materials such as copper, silver or other conductive materials such as carbon or metal oxides (indium tin oxide or ITO, zinc oxide or ZnO) deposited by a vacuum deposition process or etched by an etching process;
  from a printed circuit board or similar, rigid, semi-rigid or flexible (dielectric epoxy, polyimide, PET etc.), with one single or several layers of metal etc.;
  with conductive polymers;
  in the form of fabric or layers of fabric, with wires made from conductive material (metal, etc.) woven or knitted etc.

According to embodiments, the device according to the invention can comprise one or more transparent measurement electrodes and/or second electrodes. Such electrodes can be produced for example with a deposit of transparent conductive oxide, such as for example indium tin oxide (or ITO), on a layer of transparent polymer dielectric such as polyethylene terephthalate (PET).

The connecting tracks of at least one of the measurement electrodes and second electrodes can also be transparent.

The elastically compressible separation layer can also be produced from a transparent dielectric material. To this end, it can be produced, for example, from flexible transparent plastic or from PolyDiMethylSiloxane (or PDMS).

Alternatively or in addition, the measurement electrode can be placed on, or in, or under, a support, produced from a flexible material, such as a fabric (for example a woven or knitted structure), placed above and at a distance from the second electrode, and being at least locally deformed when a load is exerted on said support.

In this case, the measurement electrode or electrodes can be produced for example in a fabric, or in the form of fabric or layers of fabric, with wires made from a conductive material (metal, etc.) woven or knitted etc.

The device according to the invention can comprise several measurement electrodes.

The device according to the invention can comprise in particular a plurality of measurement electrodes distributed in the plane of the detection surface.

According to embodiments, the device according to the invention can comprise one or more second electrodes arranged according to at least one of the following configurations:
  at least one second electrode, placed opposite several, in particular all, the measurement electrodes;
  for at least one, in particular each, measurement electrode, a second electrode placed opposite said measurement electrode;
  for at least one, in particular each, measurement electrode, several second electrodes placed opposite said measurement electrode.

According to embodiments, the device according to the invention can also comprise at least one additional guard electrode polarized at the guard potential.

In this case, the second electrodes can be placed in, or on, a plane, called guard plane, said guard plane comprising the additional guard electrode or electrodes.

According to an embodiment, the device according to the invention can comprise:
  an array of measurement electrodes, organized in rows and columns; and
  opposite each row, respectively each column, of measurement electrodes, at least one row, respectively one column, constituted by one or more second electrode(s).

In this case the second electrodes of one and the same row, respectively one and the same column, can be at the same potential. In other words, the potential of the second electrodes of one and the same row, respectively one and the same column, is adjusted/modified in common.

When the second electrodes are placed in, or on, a guard plane, the latter can be set at the potential of the measurement electrode.

According to embodiments, the device according to the invention can comprise several measurement electrodes, and an electrode switch making it possible to selectively connect a measurement electrode, called "active electrode", to the measurement electronics, said electrode switch also being arranged in order to polarize the other measurement electrodes at the same electrical potential as the active electrode.

The electrode switch can make it possible in particular to sequentially select a plurality, or all, of the measurement electrodes as active electrode.

Thus it makes it possible to use measurement electronics (or a measurement channel) in order to carry out a sequential measurement with several measurement electrodes.

Thus, a device according to the invention with a plurality of measurement electrodes can comprise:
  measurement electronics with a single measurement channel and an electrode switch, making it possible to sequentially poll all the measurement electrodes (sequential measurements);
  one or more measurement electronics utilizing several measurement channels, each with an electrode switch making it possible to poll a portion of the measurement electrodes (sequential and parallel measurements);
  as many measurement electronics or measurement channels as measurement electrodes, without electrode switch, in order to simultaneously poll all of the measurement electrodes (parallel measurements).

According to another aspect of the same invention, a method is proposed for detecting an object with respect to a detection surface, utilizing a detection device according to the invention.

In particular, according to a general definition, the method according to the invention comprises:
- at least one iteration of a first detection step, carried out by applying to the electrodes:
  - one and the same alternating potential, called guard potential, or
  - alternating potentials that are substantially identical;

that is(are) different from a ground potential, in order to determine a capacitance, called electrode-object capacitance, seen by the at least one measurement electrode as a function of a measured first signal; and
- at least one iteration of a second detection step, comprising the following operations:
  - applying to the at least one second electrode:
    - a second potential proportional to the guard potential and having a different amplitude, or
    - the ground potential; and
  - determining a capacitance, called total capacitance, seen by the at least one measurement electrode, as a function of a measured second signal.

The method according to the invention can also comprise, in terms of steps or operation, the functions implemented by the device according to the invention, according to the characteristics described above, in each of the versions/modes/embodiment examples.

In particular, the second detection step can also comprise a calculation of a capacitance, called inter-electrode capacitance, between said measurement electrode and said second electrode as a function of the total capacitance and of the electrode-object capacitance.

According to embodiments, the second detection step can be initiated when the electrode-object capacitance reaches a predetermined threshold capacitance, or is within a range of predetermined threshold capacitances, representative of a contact between an object and the detection surface.

When the detection device comprises a plurality of measurement electrodes equipping the detection surface, the second detection step can advantageously be carried out only in an area of the detection surface in which the object was detected during the first detection step.

Thus, is it not necessary to scan the entire detection surface during the second detection step.

When the detection device comprises a plurality of measurement electrodes, the threshold capacitance can be identical for at least two, in particular all, the measurement electrodes.

Alternatively or in addition, when the detection device comprises a plurality of measurement electrodes, the threshold capacitances used for at least two electrodes can be different.

The method according to the invention can also comprise a step, called calibration step, comprising measuring and recording a threshold capacitance.

Such a calibration step can be carried out for example:
- during manufacture of the detection device in the factory;
- during use of the device, during a specific calibration procedure;
- during use of the device, periodically during the execution of measurements.

The method according to the invention can in particular comprise a calibration step with determination of a threshold capacitance taking into account at least one of the following elements: a history measurement, a measurement environment.

Thus, the threshold capacitance can in particular be updated using measurements or a history measurement of electrode-object capacitance measurements obtained in the presence of an object in contact with or pressing on the detection surface. The presence of the object can be required, for example during a specific calibration procedure, or determined automatically from total capacitance measurements.

In the presence of several measurement electrodes, the threshold capacitance can also be determined (and adapted) as a function of the measurement environment detected. It is possible for example to detect with several electrodes the size of an object on approach and to adapt the threshold capacitance value as a function of this size, for example in order to take into account the fact of whether or not an object in contact totally covers a measurement electrode.

According to embodiments, the method according to the invention can also comprise a step, called test step, carried out in the absence of the object, in order to verify the functioning of the device and comprising the following operations:
- applying the guard potential to the at least one measurement electrode;
- applying to the at least one second electrode a second potential proportional to the guard potential and having a different amplitude, or the ground potential; and
- determining a capacitance, called electrode-test capacitance, between said measurement electrode and second electrode by measuring a third signal;
- comparing said electrode-test capacitance to a second predetermined threshold capacitance.

The aim of this test step is to verify the functioning of the device.

The detected object, also called control object in the present application, can be for example a hand, wearing or not wearing a glove, any other part of the human body, a stylus, for example made from plastic or metal.

The detected object can also be any object in the environment of the detection device, such as a tool, a wall etc.

According to yet another aspect of the invention, a detection layer is proposed for an item of equipment comprising a detection device according to the invention.

The device according to the invention, in particular the electrodes, is(are) able to be integrated in the detection layer.

The item of equipment can in particular comprise an device or an electronic device, such as for example a part of a robot or a robot.

The detection layer can be placed on, or integrated in, a surface or a casing of the device.

Alternatively, the detection layer can have the form of a trim element, such as a textile trim, independent of said device.

The detection layer can also have the form of a skin (or "sensitive skin") making it possible to cover all or part of a robot for example of humanoid form. This skin can be designed so as to have an appearance (colour, surface, touch etc.) close to that of human skin.

The detection layer can also have the form of a trim part or element that is tubular in shape, suitable for being placed for example around a limb or a portion of a limb of a robot.

The equipment can also comprise an item of medical equipment or an item of equipment for medical use, such as a bed, a mattress, a seat or a seat cushion.

In this case, the detection layer can in particular be produced in the form of a trim element such a sheet or a cover, or form an integral part of the item of equipment.

In this case, the device according to the invention can be used, non-limitatively, in order to detect the presence of a body or a person, the position thereof, the load exerted (for example in order to prevent bedsores); the movements, physiological parameters (respiration, heartbeat) thereof, the presence of moisture (urine), etc.

According to yet another aspect of the invention, an item of equipment is proposed equipped with a detection device according to the invention.

The detection device can be arranged in particular so that the measurement electrode or electrodes and the second electrode or electrodes are placed on at least a portion of the periphery of the item of equipment.

According to embodiments of said item of equipment:
the measurement electrode or electrodes and the second electrode or electrodes can be placed on, or in, or under, a surface or a casing of said device;
the measurement electrode or electrodes and the second electrode or electrodes can be placed in a trim element independent of said item of equipment, and mounted on said item of equipment;
the second electrode or electrodes can be placed on, or in, or under, a surface or a casing of said device; and the measurement electrode or electrodes can be placed in a trim element independent of said item of equipment, and mounted on said item of equipment.

BRIEF DESCRIPTION OF THE DRAWINGS

Other advantages and characteristics will become apparent on examination of the detailed description of non-limitative examples and from the attached drawings in which.

DETAILED DESCRIPTION

It is well understood that the embodiments that will be described hereinafter are in no way limitative. In particular, variants of the invention may be envisaged comprising only a selection of characteristics described hereinafter, in isolation from the other characteristics described, if this selection of characteristics is sufficient to confer a technical advantage or to differentiate the invention with respect to the state of the prior art. This selection comprises at least one, preferably functional, characteristic without structural details, or with only a part of the structural details if this part alone is sufficient to confer a technical advantage or to differentiate the invention with respect to the state of the prior art.

In particular, all the variants and all the embodiments described may be combined together if there is no objection to such combination from a technical point of view.

In the figures, elements that are common to several figures retain the same reference.

Figure 1A:
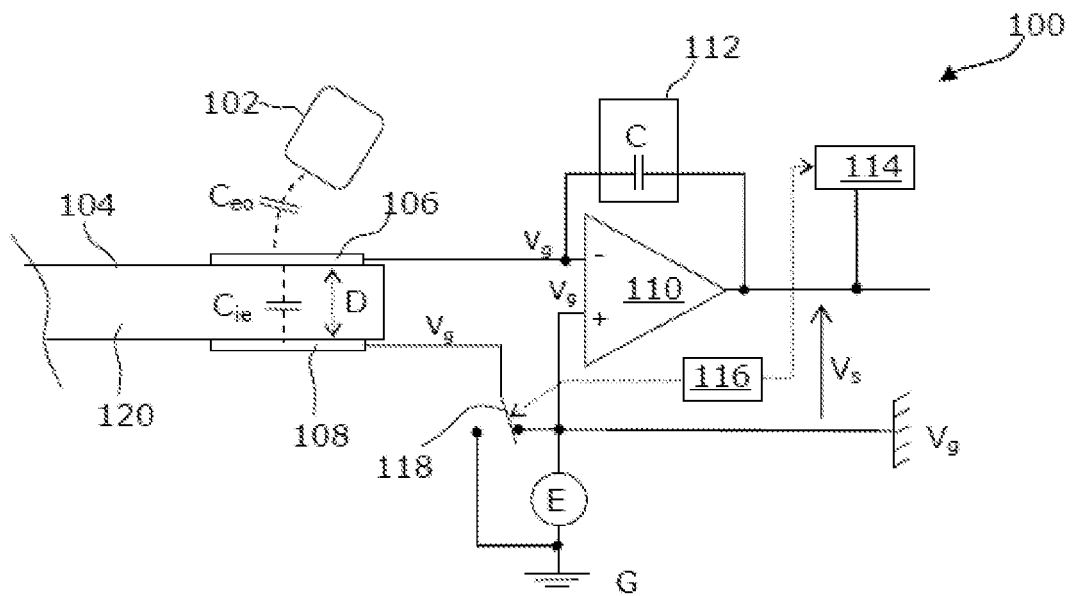
FIGS. 1a-1c are diagrammatic representations of the electrical principle of a first non-limitative embodiment example of a device according to the invention.
Figure 1B:
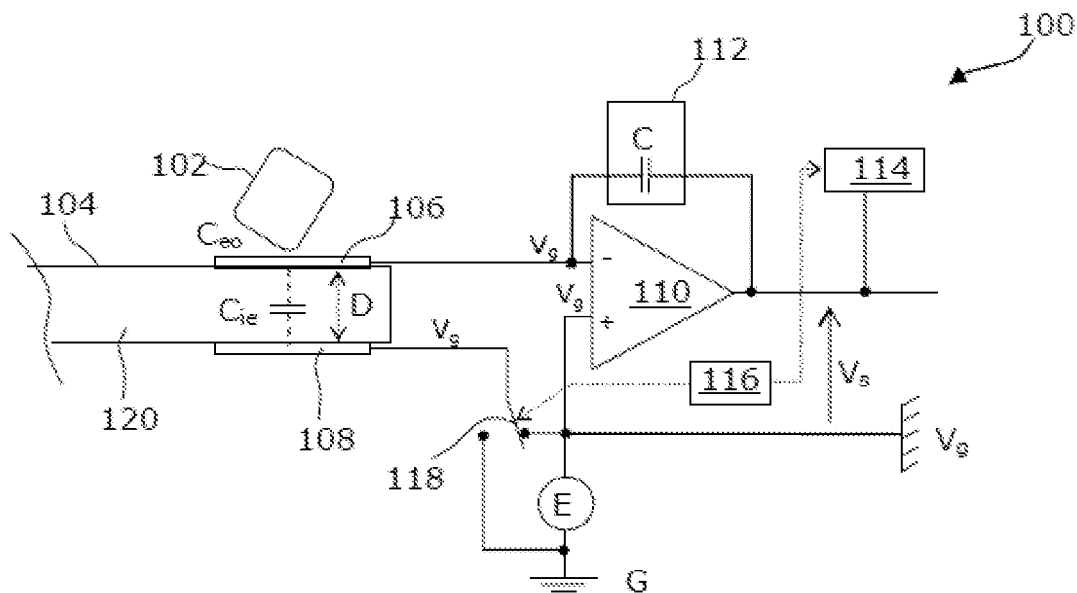
Figure 1C:
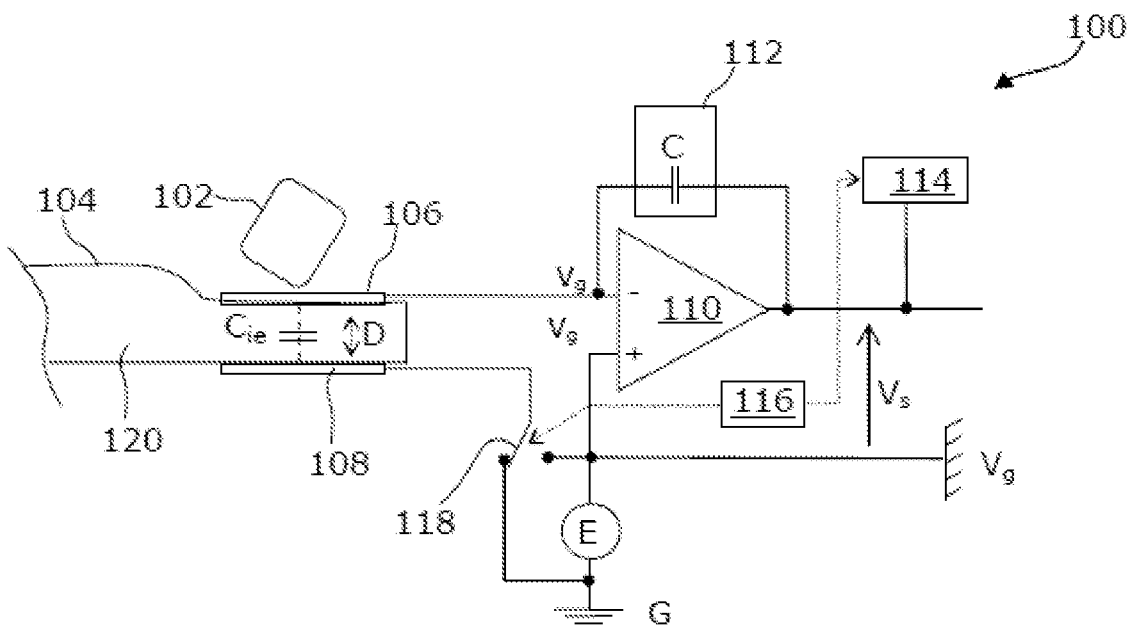

FIGS. 1a-1c are diagrammatic representations of the electrical principle of a first non-limitative embodiment example of a detection device according to the invention.

The device 100, represented diagrammatically in FIGS. 1a-1c, is intended to detect the approach, the contact and the pressure exerted by a control object 102 on a detection surface 104.

The object 102 is on approach and at a distance from the detection surface 104 in FIG. 1a, in contact with the detection surface 104 in FIG. 1b and pressing on the detection surface in FIG. 1c.

The device 100 represented in FIGS. 1a-1c comprises at least an electrode 106, called measurement electrode, placed according to a detection surface 104, and an electrode 108, called second electrode, placed facing the measurement electrode 106, below and at a distance from the measurement electrode 106.

In the embodiments shown, the detection surface 104 is represented by a face of the measurement electrode or electrodes 106, preferably covered with a thin layer of electrically insulating material (polyimide, insulating varnish, etc.) in order to avoid short-circuits with the control object 102.

The device 100 also comprises an electronic circuit which can be represented in the form of an operational amplifier (OA) 110, whose output is looped on its negative input by an impedance 112, which can be for example: a capacitor, a capacitor combined with a resistor, or
a capacitor combined with a reset or discharge switch. In the example shown, the impedance 112 is formed by a capacitor C.

A digital or analogue measurement module 114, connected to the output of the OA 110 makes it possible to measure and demodulate the voltage or the signal denoted $V_s$, on the output of the OA 110.

The device 100 also comprises an electrical source E, called guard electrical source, supplying an alternating potential, called guard potential, denoted $V_g$, different from an electrical ground, denoted G.

In the example shown in FIGS. 1a-1c:
the measurement electrode 106 is connected to the negative input of the OA 110, and
the electrical source E is connected to the positive input of the OA 110.

Due to the very high impedance and open-loop gain of the OA 110, it can be considered that the measurement electrode 106 connected to the negative input of the OA 110 is polarized at the same potential as that present on the positive input of the OA 110.

In the embodiments shown, the operational amplifier (OA) 110 is referenced to the guard potential $V_g$. To this end, it is supplied by an electrical supply source (not shown) that is also referenced to the guard potential $V_g$.

Alternatively, the operational amplifier (OA) 110 can be referenced to the ground potential, while being supplied by an electrical supply source (not shown) referenced to the electrical ground potential G.

It should be noted that the control object 102 is, by definition, normally polarized at the ground potential G directly or indirectly by resistive or capacitive coupling. Of course, it is not essential for the object to be perfectly polarized at this ground potential G. In order for it to be detectable, it must simply be polarized at a potential different from the guard potential $V_g$.

The voltage $V_s$ present on the output of the OA 110 is referenced to the guard potential $V_g$.

In order to obtain a voltage $V_s$ referenced to the general ground G, the processing module 114 can comprise in particular a differential amplifier electrically referenced to the general ground potential G. This differential amplifier is connected at the input respectively to the output of the OA 110 and to the guard potential and produces at the output an image signal of $V_s$ referenced to the general ground potential G.

The device 100 also comprises a control module 116 controlling the operation of a controllable switch 118, placed between the second electrode 108 and the electrical source E. The controllable switch 118 is placed so that:

in a first position, represented in FIGS. 1a and 1b, it connects the second electrode 108 to the guard potential $V_g$; and in a second position, represented in FIG. 1c, it connects the second electrode 108 to the ground potential G.

The controllable switch 118 is controlled in order to pass from the first position to the second position, in particular when the capacitance $C_{eo}$, called electrode-object capacitance, formed between the measurement electrode 106 and the control object 102, reaches a predetermined threshold capacitance, denoted $C_s$, predetermined and recorded in a recording means (not shown), for example in the control module 116. This threshold capacitance $C_s$ is predetermined and represents a contact between the control object 102 and the detection surface 104, as represented in FIG. 1b.

The measurement electrode 106 is arranged such that the distance D between the measurement electrode 106 and the second electrode 108 can be elastically modified, locally, by a load exerted by the control object 102 on the detection surface 104. In particular, when a load is applied on the detection surface 104, the measurement electrode 106 moves closer to the second electrode 108, as shown in FIG. 1c. To this end, the measurement electrode 106 and the second electrode 108 are placed on either side of a layer 120 formed by an elastically compressible dielectric material, such as for example a foam or a silicone.

Under these conditions, the approach and the contact of the control object 102 with the detection surface 104 are detected as a function of the value of the capacitance $C_{eo}$ formed between the measurement electrode 106 and the control object 102. When the capacitance $C_{eo}$ reaches a threshold capacitance $C_s$, this indicates that the object 102 is in contact with the detection surface 104. In this case, the load exerted by the control object 102 is detected as a function of the capacitance $C_{ie}$, called inter-electrode capacitance, formed between the measurement electrode 106 and the guard electrode 108.

In order to determine the capacitance $C_{eo}$, representative of the approach and the contact of the control object 102 with the detection surface 104, a first signal is measured periodically by setting the measurement electrode 106 and the second electrode 108 to the same alternating potential, i.e. to the guard potential $V_g$ supplied by the source E (FIG. 1a). In this configuration:

$$V_s = V_g \frac{C_{eo}}{C} \quad (1)$$

This relationship (1) makes it possible to deduce the value of the electrode-object capacitance $C_{eo}$ from the measured first signal $V_s$.

It should be noted that in this configuration, the second electrode 108 acts as a guard electrode which prevents the appearance of parasitic coupling or leakage capacitances with the measurement electrode 106.

While the control object 102 is at a distance from the detection surface 104, only the electrode-object capacitance $C_{eo}$ need be measured.

When the control object 102 comes in contact with the detection surface 104, or in immediate proximity to this surface (semi-contact), it is necessary to also measure the inter-electrode capacitance $C_{ie}$, representative of the pressure of the control object 102 on the detection surface 104. This inter-electrode capacitance $C_{ie}$ is determined in the following manner.

The contact between the control object 102 and the detection surface 104 is determined when the capacitance $C_{eo}$ reaches a predetermined threshold value $C_s$ (or a range of threshold capacitances) (FIG. 1b). At that moment, the controllable switch 118 is toggled so as to connect the guard electrode 108 to the ground potential G, as shown in FIG. 1c. In this configuration, a second signal $V_s$ is measured at the output of the OA 110. This second signal $V_s$ is representative of a capacitance $C_T$, called total capacitance, seen by the measurement electrode 106, so that:

$$V_s = V_g \frac{C_T}{C} \quad (2)$$

This relationship (2) makes it possible to deduce the value of the total capacitance $C_T$ from the measured second signal $V_s$.

Yet, the total capacitance $C_T$ corresponds to the sum of:
the electrode-object capacitance $C_{eo}$, and
the inter-electrode capacitance $C_{ie}$ which appears between the measurement electrode 106 and the second electrode 108 due to their potential difference.

As the object 102 is in contact with the control surface 104, the electrode-object capacitance $C_{eo}$ no longer varies and is still equal to (or close to) the capacitance $C_s$. Consequently, the value of the inter-electrode capacitance $C_{ie}$, representative of the pressure of the object 102 on the detection surface 104, is obtained by subtraction, according to the following relationship:

$$C_{ie} = C_T - C_s \quad (3)$$

or $$C_{ie} = C_T - C_{eoT} \quad (4)$$

Where $C_{eoT}$ is the electrode-object capacitance measured with the object in contact.

In this configuration, it is necessary to verify periodically if the control object 102 is still in contact with the detection surface 104. To this end, the controllable switch 118 is toggled periodically so as to connect the guard electrode 108 to the guard potential $V_g$ in order to measure the electrode-object capacitance $C_{eo}$, then to the ground G in order to measure the total capacitance $C_T$, and thus the inter-electrode capacitance $C_{ie}$. These sequential measurements of $C_{eo}$ and $C_T$ are carried out as long as the electrode-object capacitance is higher than the threshold capacitance ($C_{eo} \geq C_s$).

By using for example the parallel-plate capacitor law, it is possible to link the electrode-object capacitance $C_{eo}$ and the inter-electrode capacitance $C_{ie}$ respectively to a distance between the measurement electrode and the object, and to a distance D between the measurement electrode and the second electrode. The load can thus be calculated from the variation in the measured thickness D of the dielectric material 120, and its modulus of elasticity.

Determination of each of these capacitances from measured signals can be carried out by the measurement module 114, or by the control module, or even by one or more additional calculation module(s) (not shown).

To this end, it is possible to utilize a synchronous demodulator which carries out multiplication functions of the signal $V_s$ originating from the OA 110 with a carrier signal corresponding to the guard potential $V_g$, then low-pass filtering.

It is also possible to use an asynchronous demodulator comprising a rectification followed by a low-pass filter.

Figure 2:
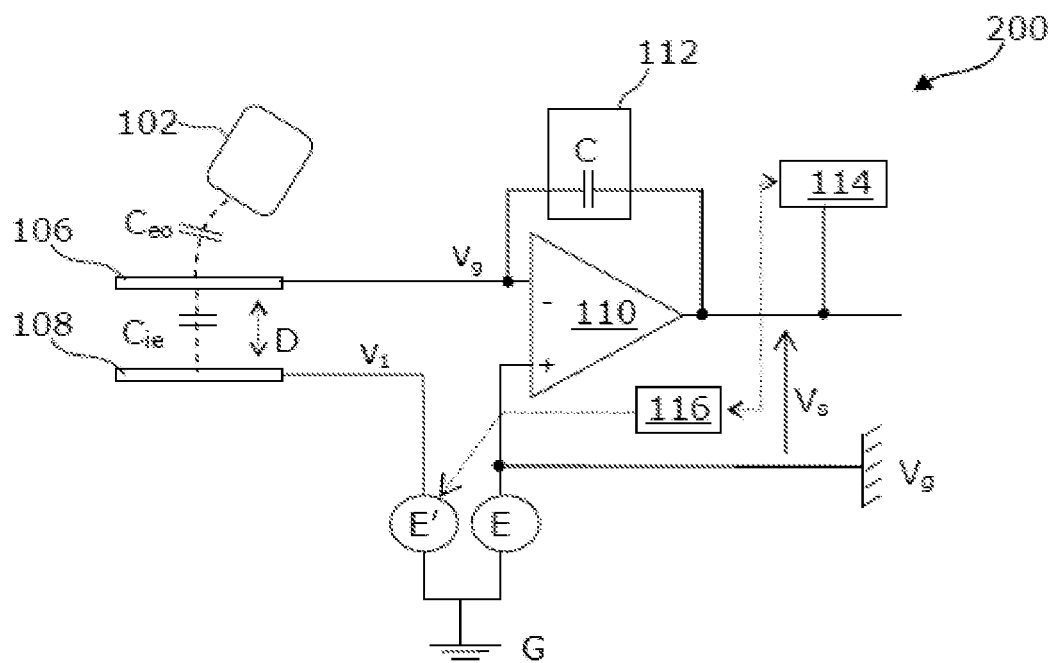
FIG. 2 is a diagrammatic representation of the electrical principle of a second non-limitative embodiment example of a device according to the invention.

FIG. 2 is a simplified diagrammatic representation of the electrical principle of a second embodiment example of a device according to the invention.

The device 200, shown in FIG. 2, comprises all the elements of the device 100 in FIGS. 1a-1c.

Unlike the device 100, the device 200 does not comprise the controllable switch and comprises a second source E' placed between the second electrode 108 and the ground potential G.

The second source E' is controlled by the control module 116 so that:
- the second source E' supplies a potential V1 that is identical or substantially identical to the guard potential $V_g$ during measurement of the first signal: in this case the second electrode 108 is polarized (like the measurement electrode 106) at the guard potential $V_g$; and
- the second source E' supplies a second potential V1 proportional to, and of amplitude less than, the guard potential $V_g$ (V1=k$V_g$ where k<1) during measurement of the second signal: in this case the second electrode 108 is polarized at the potential V1 and the measurement electrode 106 is polarized at the guard potential $V_g$.

As above, the second source E' is controlled in order to supply the guard potential $V_g$ as long as the capacitance $C_{eo}$ is less than the threshold capacitance $C_s$, then when the capacitance $C_{eo}$ reaches the capacitance $C_s$, it is controlled in order to supply the second potential V1=k$V_g$ and the guard potential $V_g$ alternately.

In practice, the source E and the second source E' are generated from one and the same oscillator or one and the same function generator in order to produce signals of identical shape, in phase, and which only differ in their amplitude.

The use of a second potential has the advantage of allowing an adjustment of the gain of the detection in order to be able to detect the electrode-object capacitance $C_{eo}$ and the total capacitance $C_T$ under optimal conditions. Indeed, due to the relationship between the opposing surfaces, the inter-electrode capacity $C_{ie}$ and thus the total capacity $C_T$ can be several orders of magnitude greater than the electrode-object capacitance $C_{eo}$.

Using the second potential V1=k$V_g$, the signals measured as indicated above become respectively:

$$V_s = V_g \frac{C_{eo}}{C} \text{ and} \tag{5}$$

$$V_s = \frac{V_g}{C}(C_{eo} + (1-k)C_{eg}) = \frac{V_g}{C}(C_T - kC_{eg}) \tag{6}$$

It is thus possible to optimize the detection gain in order to detect the electrode-object capacitance $C_{eo}$ corresponding to distant objects, and to detect the total capacitances $C_T$ without saturation due to the attenuation of a factor (1−k) obtained.

Alternatively, the second source E' can be controlled by the control module 116 so as to either supply the guard potential $V_g$, or to be turned off so that the second electrode is polarized at the ground potential G. In this case, in the device 200 in FIG. 2, it is also possible to add a controllable switch between the guard electrode 106 and the second source E', in order to avoid turning off and turning on the second source E', such a controllable switch connecting the second electrode 108:
- to the second source E' in order to measure the first signal; and
- to the ground potential G in order to measure the second signal.

Of course, in all the embodiments presented, the measurement of the total capacitance $C_T$ can be carried out according to other criteria than a detection of the condition in which the electrode-object capacitance $C_{eo}$ reaches the threshold capacitance $C_s$.

In particular, it is possible to periodically and sequentially measure the electrode-object capacitance $C_{eo}$ and the total capacitance $C_T$ as described above, in the same manner and without taking into account the fact of whether or not the control object 102 is in contact with the detection surface 104.

It is also possible to periodically carry out a verification of the satisfactory operation of the system. To this end:
- in the absence of objects 102 (or at least when the measured values of the electrode-object capacitance $C_{eo}$ are sufficiently low as to correspond to an absence of objects), a measurement of the total capacitance $C_T$ is carried out, which under these conditions must correspond to a measurement of the inter-electrode capacitance $C_{ie}$;
- the value of the inter-electrode capacitance $C_{ie}$ obtained is compared to an expected inter-electrode capacitance value or range of values, and if the difference does not satisfy a pre-established criterion, the system can be considered to be faulty and an alarm triggered.

It is also possible to calibrate the inter-electrode capacitance measurements in order, for example, to take into account the ageing or irreversible deformations of the dielectric material 120, and thus produce more precise load or force measurements. To this end:
- in the absence of objects 102 in contact with the detection surface 104 (or at least when the measured values of electrode-object capacitance $C_{eo}$ are sufficiently low as to correspond to an object at a distance from the detection surface or an absence of objects), a measurement of the total capacitance $C_T$ is carried out, which under these conditions must correspond to a measurement of the inter-electrode capacitance $C_{ie}$;
 This measurement of the inter-electrode capacitance $C_{ie}$ is used as reference value that is a "no-load" value, or without depression, and/or
 a nominal thickness of dielectric 120 (i.e. without applied stress) is deduced therefrom.

Figure 3:
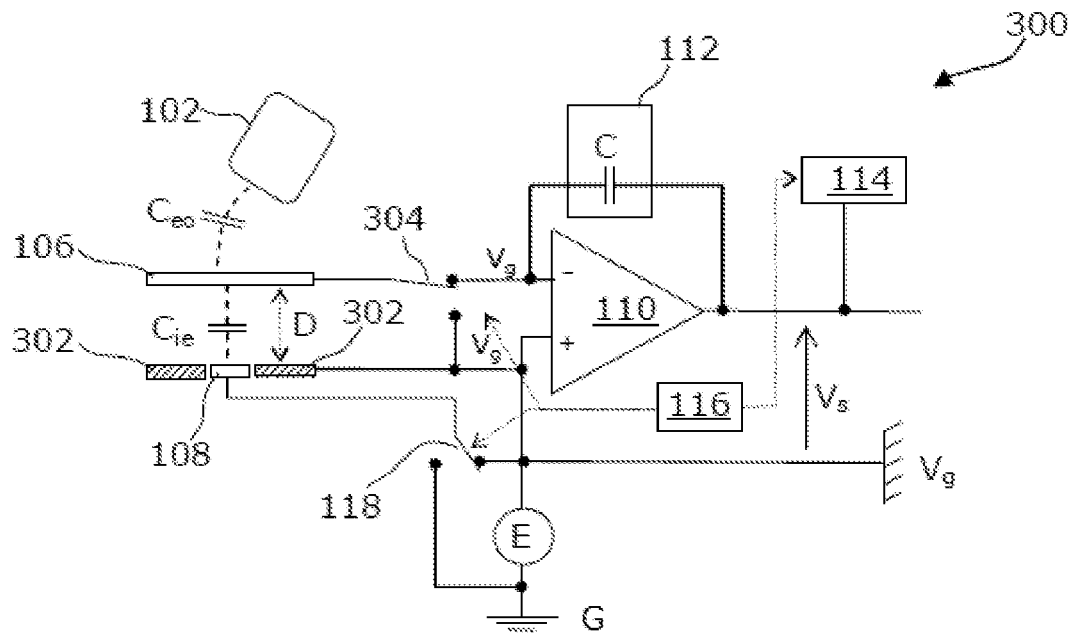
FIG. 3 is a diagrammatic representation of the electrical principle of a third non-limitative embodiment example of a device according to the invention.

FIG. 3 is a simplified diagrammatic representation of the electrical principle of a third embodiment example of a device according to the invention.

The device 300, shown in FIG. 3, comprises all the elements of the device 100 in FIGS. 1a-1c.

Unlike the device 100, the device 300 comprises, in addition to the measurement electrode 106 and the second electrode 108, additional guard electrodes 302.

These additional guard electrodes 302 are polarized at the guard potential $V_g$, like the measurement electrodes 106, and thus serve as active guard electrodes in order to remove the parasitic or leakage coupling capacitances with the environment. To this end, they can be connected to the positive input of the OA 110, as shown. In particular, the additional guard electrodes 302 can be produced in the form of an additional openwork guard plane with the second electrodes 108 placed in the openings of this additional guard plane 302.

Thus, in order to measure the first signal, all the electrodes 106, 108 and 302 are polarized at the guard potential $V_g$. For the measurement of the second signal, the measurement electrode 106 and the additional guard electrode 302 are kept at the guard potential $V_g$, and the second electrode 108 is set at the ground potential G, by the switch 118 controlled by the control module 116.

The device 300 is also arranged in order to make it possible to manage a plurality of measurement electrodes 106 sequentially with one and the same electronic detection unit (and in particular one and the same OA 110). To this end, it comprises an electrode switch 304 which makes it possible to selectively connect the measurement electrodes 106 either to the negative input of the OA 110 in order to carry out measurements (active measurement electrode 106) or to the guard potential $V_g$ for example at the positive input of the OA 110. The electrode switch 304 is also arranged so that when a measurement electrode 106 is connected to the input of the OA 110, thus active, the other measurement electrodes 106 are polarized at the guard potential $V_g$ and contribute to the guard elements.

In a configuration with a plurality of measurement electrodes 106, the switch 118 which controls the potential of the second electrode can be configured in different ways.

In order to measure the first signal, all the second electrodes 108 are polarized at the guard potential $V_g$.

In order to measure the second signal, the switch 118 can be configured so as to:
- either connect all the second electrodes 108 to the ground potential G;
- or connect the second electrode 108 opposite the active measurement electrode 106 (connected to the negative input of the OA 110) to the ground potential G and connect all the other second electrodes 108 to the guard potential $V_g$ so that they contribute to the guard elements.

Of course, alternative embodiment examples may be obtained by combining the embodiment example in FIG. 3 with that in FIG. 2, i.e. using a second source E' in order to polarize the second electrodes 108 at a second potential for the measurement of the second signal, as described above.

Figure 4:
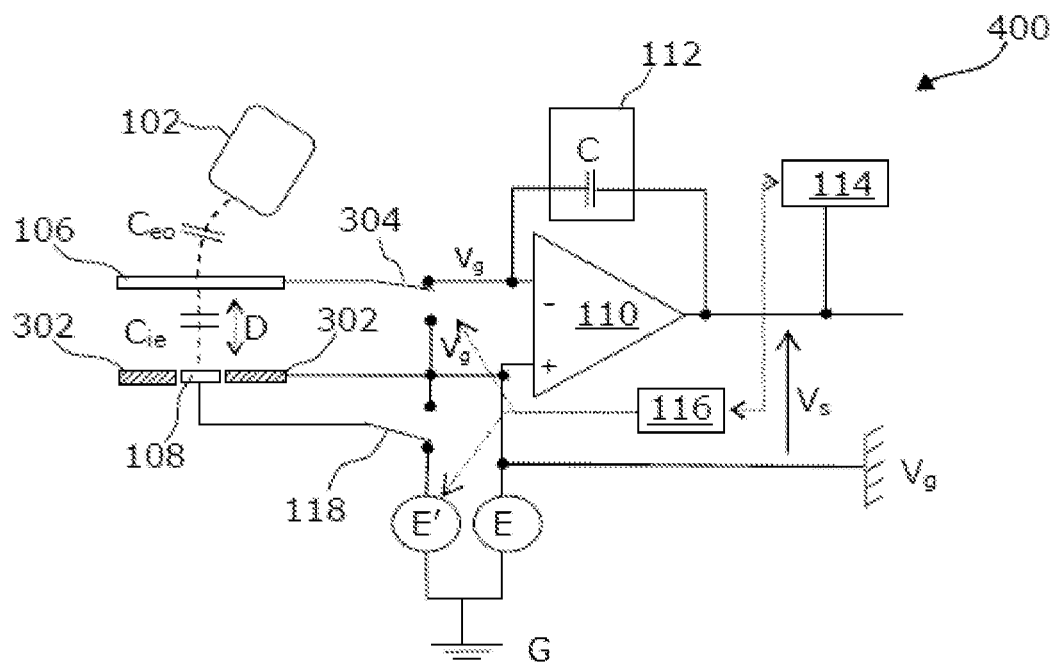
FIG. 4 is a diagrammatic representation of the electrical principle of a fourth non-limitative embodiment example of a device according to the invention.

FIG. 4 is a simplified diagrammatic representation of the electrical principle of such an alternative embodiment example.

In order to manage a plurality of electrodes 106, it is possible to utilize an electrode switch 304 as described above.

It is also possible to utilize a switch 118 in order to switch the potential of the second electrode or electrodes 108, either to the guard potential $V_g$, or to the second potential as generated by the second source E'.

As above, in order to measure the second signal, the switch 118 can thus be configured so as to:
- either connect all the second electrodes 108 to the second potential of the second source E';
- or connect the second electrode 108 facing the active measurement electrode 106 (connected to the negative input of the OA 110) to the second potential and connect all the other second electrodes 108 to the guard potential $V_g$ so that they contribute to the guard elements.

Figure 5:
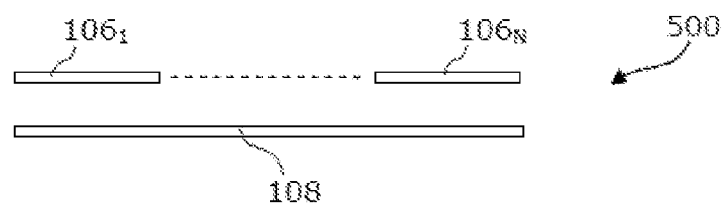
FIGS. 5-8 are diagrammatic representations of different configurations of electrodes that can be implemented in a device according to the invention.

FIG. 5 is a diagrammatic representation of a first configuration of electrodes which can be utilized in a device according to the invention.

In the configuration 500, represented in FIG. 5, the device can comprise a plurality of measurement electrodes $106_1$-$106_N$, and a second single electrode 108 common to all the measurement electrodes $106_1$-$106_N$.

Figure 6:
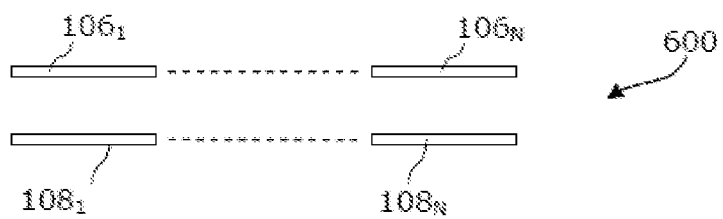

FIG. 6 is a diagrammatic representation of a second configuration of electrodes which can be utilized in a device according to the invention.

Figure 8:
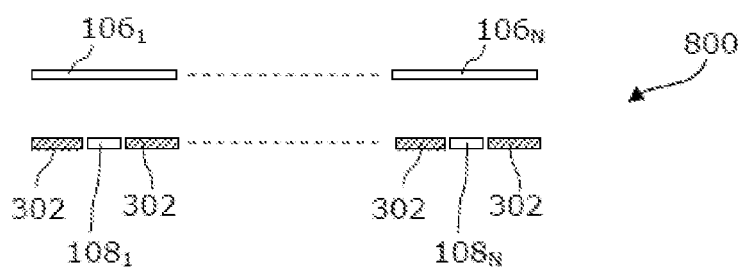

In the configuration 600, represented in FIG. 8, the device can comprise a plurality of measurement electrodes $106_1$-$106_N$, and a second individual electrode, respectively $108_1$-$108_N$, for each measurement electrode $106_1$-$106_N$.

Figure 7:
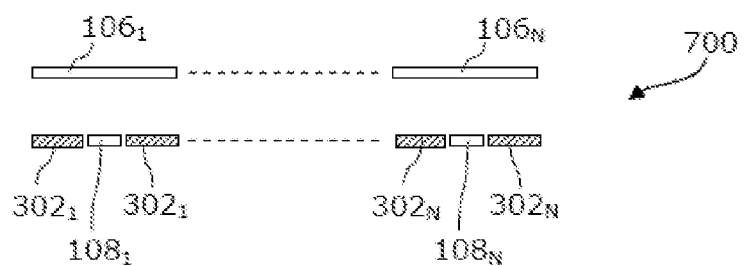

FIG. 7 is a diagrammatic representation of a third configuration of electrodes which can be utilized in a device according to the invention.

In the configuration 700, represented in FIG. 7, the device can comprise a plurality of measurement electrodes $106_1$-$106_N$ and for each measurement electrode $106_1$-$106_N$:
- a second individual electrode, respectively $108_1$-$108_N$; and
- an individual openwork additional guard electrode, respectively $302_1$-$302_N$.

FIG. 8 is a diagrammatic representation of a fourth configuration of electrodes which can be utilized in a device according to the invention.

In the configuration 800, represented in FIG. 8, the device can comprise a plurality of measurement electrodes $106_1$-$106_N$.

The device also comprises one single additional guard electrode 302, common to the set of measurement electrodes $106_1$-$106_N$, and forming a guard plane.

The device comprises for each measurement electrode $106_1$-$106_N$, a second individual electrode, respectively $108_1$-$108_N$, inserted into the guard plane formed by the single additional guard electrode 302.

Figure 9:
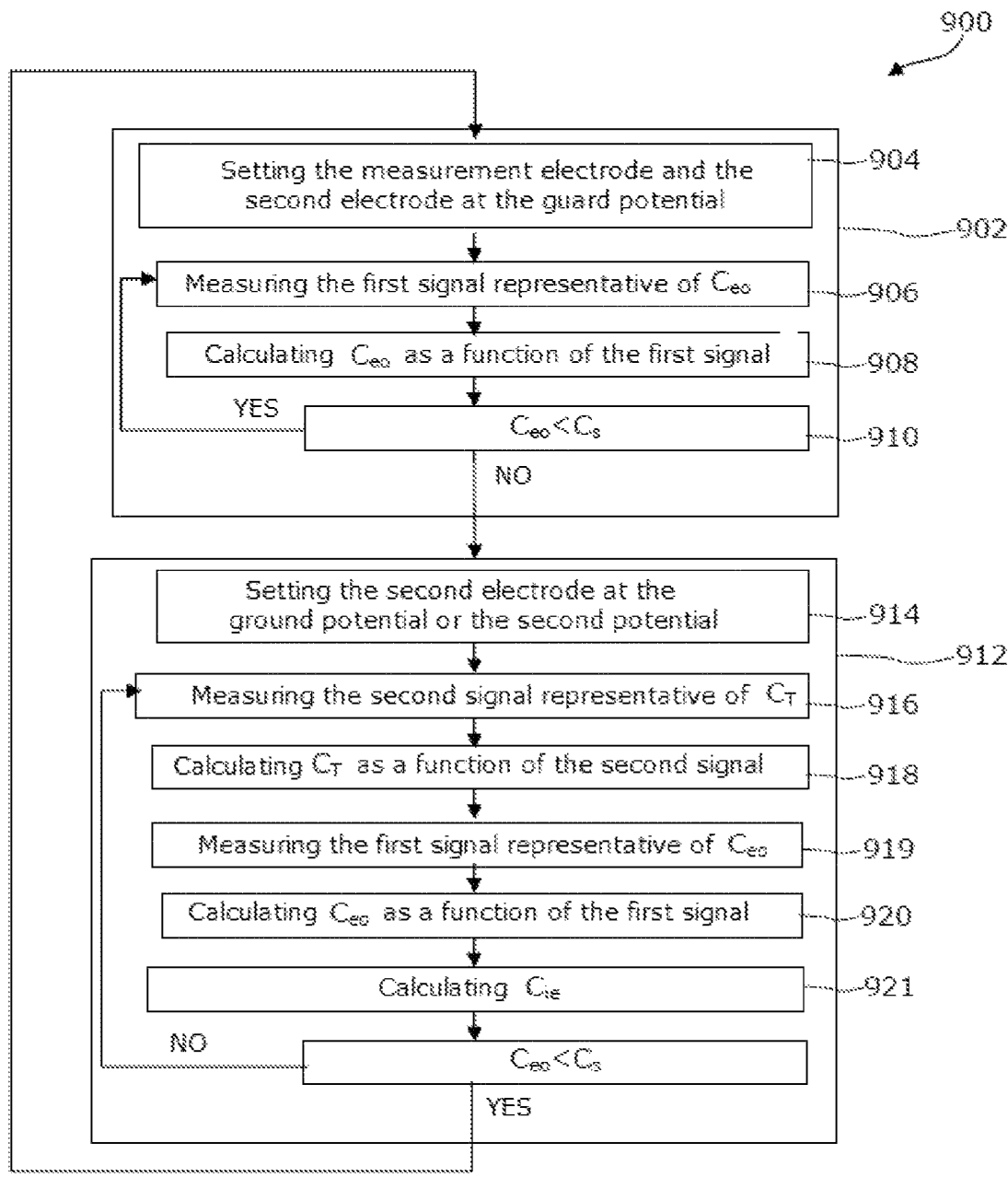
FIG. 9 is a diagrammatic representation, in the form of a flow chart, of a non-limitative embodiment example of a method according to the invention.

FIG. 9 is a diagrammatic representation, in the form of a flow chart, of a non-limitative embodiment of a detection method according to the invention.

The method 900 comprises one or more iteration(s) of a first detection step 902, carried out when a control object approaches the detection surface.

This first detection step 902 comprises step 904 of setting the measurement electrode and the second electrode, which can be a guard electrode or a test electrode, to the guard potential as described above.

Thus, a step 906 measures a first signal representative of the electrode-object capacitance $C_{eo}$.

As a function of the measured signal, the capacitance $C_{eo}$ is calculated during a step 908.

During a step 910, the measured capacitance $C_{eo}$ is compared to a predetermined threshold capacitance $C_s$ representing an electrode-object capacitance obtained when there is contact between the control object and the detection surface.

If the capacitance $C_{eo}<C_s$, then step 904 is reiterated, for example at a predetermined frequency.

If the capacitance $C_{eo} \geq C_s$ then step 904 is followed by a second detection step 912.

This second detection step 912 comprises step 914 of setting the second electrode to the ground potential or to the second potential. The measurement electrode is kept at the guard potential.

Then, step 916 performs a measurement of a second signal representative of the total capacitance $C_T$ seen by the measurement electrode.

As a function of the measured second signal, the capacitance $C_T$ is calculated during step 918.

Then, step 919 measures a first signal representative of the electrode-object capacitance $C_{eo}$.

As a function of the measured signal, the capacitance $C_{eo}$ is calculated during step 920.

During step 921, the inter-electrode capacitance $C_{ie}$, representative of the pressure of the control object on the detection surface, is calculated by subtracting the threshold capacitance $C_s$ from the calculated capacitance $C_T$.

While the capacitance $C_{eo} \geq C_s$ then step 912 is reiterated. Else, the method 900 resumes at step 902.

It should be noted that the steps of measuring the capacitance $C_{eo}$ in order to determine the inter-electrode capacitance $C_{ie}$ may not be performed at all the iterations of the second detection step 912, but more infrequently, and the capacitance $C_{eo}$ recorded.

Of course, the invention is not limited to the examples which have just been described and numerous adjustments can be made to these examples without exceeding the scope of the invention.

The invention claimed is:

1. A device for detecting an object with respect to a detection surface comprising:
   at least one electrode, called measurement electrode;
   at least one second electrode, placed facing said measurement electrode;
   said electrodes are separated by a distance (D) that is elastically modifiable locally, by a load exerted by said object on said detection surface;
   and at least one control means arranged in order to:
   apply to said electrodes:
      a same alternating potential ($V_g$), called guard potential;
      that is different from a ground potential (G), so as to measure a first electrical signal with respect to a capacitance ($C_{eo}$), called electrode-object capacitance, between said measurement electrode and said object; and
   apply to said second electrode:
      a second potential proportional to the guard potential ($V_g$) and having a different amplitude, or
      the ground potential (G),
      so as to measure a second electrical signal with respect to the capacitance, called total capacitance, seen by said measurement electrode.

2. The device according to claim 1, characterized in that it comprises at least one calculation module configured to calculate a capacitance ($C_{ie}$), called inter-electrode capacitance, between said measurement electrode and said second electrode, as a function of said total capacitance and said electrode-object capacitance ($C_{eo}$).

3. The device according to claim 1, characterized in that it comprises a calculation module configured to at least one of:
   determine a distance or a contact between the object and the detection surface as a function of the first electrical signal; and
   determine a load, a force or a pressure applied by said object on the detection surface as a function of the second electrical signal.

4. The device according to claim 1, characterized in that the measurement electrode and the second electrode are separated by a layer that is elastically compressible comprising, or formed by, a dielectric material.

5. The device according to claim 1, characterized in that the measurement electrode is placed on, or in, or under, a support, produced from a flexible material, placed above and at a distance from the second electrode, and deforming at least locally when a load is exerted on said support.

6. The device according to claim 1, characterized in that it comprises several measurement electrodes.

7. The device according to claim 6, characterized in that it comprises one or more second electrodes arranged according to at least one of the following configurations:
   at least one second electrode placed opposite several, of the measurement electrodes;
   for at least one measurement electrode, a second electrode placed opposite said measurement electrode;
   for at least one measurement electrode, several second electrodes placed opposite said measurement electrode.

8. The device according to claim 1, characterized in that it comprises:
   an array of measurement electrodes, organized in rows and columns; and
   opposite each row, respectively each column, measurement electrodes, at least one row, respectively one column, constituted by one or more second electrode(s);
   the second electrode(s) of one and the same row, respectively one and the same column, being at the same potential.

9. A method for detecting an object with respect to a detection surface with a detection device according to claim 1, said method comprising at least one iteration of a first detection step, carried out by applying to the electrodes:
   a same alternating potential ($V_g$), called guard potential; that is different to a ground potential (G), in order to determine a capacitance ($C_{eo}$), called electrode-object capacitance, seen by the at least one measurement electrode as a function of a measured first signal;
at least one iteration of a second detection step, comprising the following operations:
   applying to the at least one second electrode:
      a second potential proportional to the guard potential ($V_g$) and having a different amplitude, or
      the ground potential (G); and
   determining a capacitance, called total capacitance, seen by the at least one measurement electrode as a function of a measured second signal.

10. The method according to claim 9, characterized in that the second detection step also comprises a step of calculating a capacitance ($C_{ie}$), called inter-electrode capacitance, between said measurement electrode and said second electrode as a function of the total capacitance and of the electrode-object capacitance ($C_{eo}$).

11. The method according to claim 9, characterized in that the second detection step is initiated when the electrode-object capacitance ($C_{eo}$) reaches a predetermined threshold capacitance, or is within a predetermined range of threshold capacitances, representative of a contact between an object and the detection surface.

12. The method according to claim 11, characterized in that the detection device comprises a plurality of measurement electrodes equipping the detection surface, the second detection step being carried out only in an area of the detection surface in which the object was detected during the first detection step.

13. The method according to claim 11, characterized in that it comprises a step, called calibration step, comprising measuring and recording a threshold capacitance.

14. The method according to claim 13, characterized in that the calibration step comprises a determination of a threshold capacitance taking into account at least one of the following elements: a history measurement, a measurement environment.

15. The method according to claim 9, characterized in that it also comprises a step, called test step, carried out in the absence of the object, in order to verify the functioning of the device and comprising the following operations:
  applying the guard potential ($V_g$) to the at least one measurement electrode;
  applying to the at least one second electrode a second potential between the guard potential ($V_g$) and the ground potential (G), or the ground potential (G);
  determining a capacitance, called electrode-test capacitance, between said measurement electrode and second electrode by measuring a third signal; and
  comparing said electrode-test capacitance to a second predetermined threshold capacitance.

16. A detection layer, for an item of equipment, comprising a detection device according to claim 1.

17. An item of equipment equipped with a detection device according to claim 1.

18. A method for detecting an object with respect to a detection surface with a detection device according to claim 1, said method comprising at least one iteration of a first detection step, carried out by applying to the electrodes:
  a same alternating potential ($V_g$), called guard potential; that is different to a ground potential (G), in order to determine a capacitance ($C_{eo}$), called electrode-object capacitance, seen by the at least one measurement electrode as a function of a measured first signal;
at least one iteration of a second detection step, comprising the following operations:
  applying to the at least one second electrode:
    a second potential proportional to the guard potential ($V_g$) and having a different amplitude, or
    the ground potential (G);
  determining a capacitance, called total capacitance, seen by the at least one measurement electrode as a function of a measured second signal; and
  performing a test step, carried out in the absence of the object, in order to verify the functioning of the device and comprising the following operations:
  applying the guard potential ($V_g$) to the at least one measurement electrode;
  applying to the at least one second electrode a second potential between the guard potential ($V_g$) and the ground potential (G), or the ground potential (G);
  determining a capacitance, called electrode-test capacitance, between said measurement electrode and second electrode by measuring a third signal; and
  comparing said electrode-test capacitance to a second predetermined threshold capacitance.

* * * * *